United States Patent
Lindberg

(10) Patent No.: US 11,152,231 B2
(45) Date of Patent: Oct. 19, 2021

(54) HEATING APPARATUS, METHOD AND SYSTEM FOR PRODUCING SEMICONDUCTOR CHIPS IN THE WAFER ASSEMBLY

(71) Applicant: OSRAM OLED GMBH, Regensburg (DE)

(72) Inventor: Hans Lindberg, Bad Abbach (DE)

(73) Assignee: OSRAM OLED GMBH, Regensburg (DE)

(*) Notice: Subject to any disclaimer, the term of this patent is extended or adjusted under 35 U.S.C. 154(b) by 0 days.

(21) Appl. No.: 16/340,364

(22) PCT Filed: Oct. 11, 2017

(86) PCT No.: PCT/EP2017/075931
§ 371 (c)(1),
(2) Date: Apr. 8, 2019

(87) PCT Pub. No.: WO2018/069387
PCT Pub. Date: Apr. 19, 2018

(65) Prior Publication Data
US 2019/0244839 A1    Aug. 8, 2019

(30) Foreign Application Priority Data
Oct. 11, 2016 (DE) .................... 102016119328.3

(51) Int. Cl.
*H01L 21/67*    (2006.01)
*H01L 21/687*   (2006.01)
(Continued)

(52) U.S. Cl.
CPC .... *H01L 21/67103* (2013.01); *C23C 16/4584* (2013.01); *C23C 16/46* (2013.01);
(Continued)

(58) Field of Classification Search
None
See application file for complete search history.

(56) References Cited

U.S. PATENT DOCUMENTS

| 6,316,754 B1 | 11/2001 | Schatz et al. |
| 9,018,105 B2 | 4/2015 | Strauch |
| 2009/0184109 A1 | 7/2009 | Sawada et al. |
| 2011/0185969 A1 | 8/2011 | Yang |

(Continued)

FOREIGN PATENT DOCUMENTS

| DE | 102013109155 A1 | 2/2015 |
| JP | H1140503 A | 2/1999 |

(Continued)

*Primary Examiner* — Jack S Chen
(74) *Attorney, Agent, or Firm* — Slater Matsil, LLP

(57) ABSTRACT

A heating apparatus, a method and a system for producing semiconductor chips in a wafer assembly are disclosed. In an embodiment a heating device includes a heating plane configured to be arranged parallel to a plane of the semiconductor chips in the wafer composite and a first heating unit extending substantially in a radial direction with respect to a reference point in the heating plane, wherein the first heating unit includes a plurality of inductive heating elements arranged adjacent to each other in a substantially radial direction, each inductive heating element having a predetermined distance from the reference point, and wherein the inductive heating elements are formed as electromagnets or permanent magnets configured to generate eddy currents in a carrier of the wafer composite.

12 Claims, 4 Drawing Sheets

(51) Int. Cl.
  *C23C 16/46*   (2006.01)
  *C30B 25/10*   (2006.01)
  *C23C 16/458*  (2006.01)
  *H01L 21/324*  (2006.01)
  *H01L 21/66*   (2006.01)
  *H05B 6/40*    (2006.01)

(52) U.S. Cl.
  CPC ............ *C30B 25/10* (2013.01); *H01L 21/324* (2013.01); *H01L 21/67115* (2013.01); *H01L 21/67248* (2013.01); *H01L 21/68764* (2013.01); *H01L 21/68771* (2013.01); *H01L 22/26* (2013.01); *C23C 16/4586* (2013.01); *H05B 6/40* (2013.01)

(56) References Cited

U.S. PATENT DOCUMENTS

| | | | |
|---|---|---|---|
| 2011/0259879 A1 | 10/2011 | Hanawa et al. | |
| 2013/0140298 A1 | 6/2013 | Uchida et al. | |
| 2013/0264335 A1 | 10/2013 | Uchida | |
| 2016/0204008 A1* | 7/2016 | Brien | H01L 21/67103 |
| | | | 219/634 |

FOREIGN PATENT DOCUMENTS

| | | |
|---|---|---|
| JP | 2003179040 A | 6/2003 |
| JP | 2008159759 A | 7/2008 |
| JP | 2012156111 A | 8/2012 |
| JP | 2013185760 A | 9/2013 |
| JP | 2014026884 A | 2/2014 |
| WO | 2011022637 A1 | 2/2011 |

\* cited by examiner

HEATING APPARATUS, METHOD AND SYSTEM FOR PRODUCING SEMICONDUCTOR CHIPS IN THE WAFER ASSEMBLY

This patent application is a national phase filing under section 371 of PCT/EP2017/075931, filed Oct. 11, 2017, which claims the priority of German patent application 102016119328.3, filed Oct. 11, 2016, each of which is incorporated herein by reference in its entirety.

TECHNICAL FIELD

The invention relates to a heating device for producing semiconductor chips in a wafer composite as well as a corresponding method and system for producing semiconductor chips in a wafer composite.

BACKGROUND

Local temperature differences of a wafer composite during the production of semiconductor chips in the wafer composite can lead to an inhomogeneous performance of the semiconductor chips. For example, in the production of light-emitting diode chips under inhomogeneous temperature distribution, a shift in the wavelength and/or an influence on the brightness of the light-emitting diode chips produced in this way can be expected during operation.

SUMMARY OF THE INVENTION

Embodiments provide a heating device for producing semiconductor chips in a wafer composite and a corresponding method and system that contribute to locally precisely influencing a temperature of the wafer composite during production.

According to a first aspect, embodiments of the invention relate to a heating device for producing semiconductor chips in a wafer composite. The semiconductor chips can in particular be optoelectronic semiconductor chips such as light-emitting diode chips. A wafer composite comprises at least one semiconductor chip, preferably a plurality of semiconductor chips, which are arranged in an exemplarily disc-shaped composite during production.

The heating device is in particular a device for influencing the temperature of the wafer composite during the production of the at least one semiconductor chip. The heating device can advantageously be designed to influence the temperature of several wafer composites in one process step of the production simultaneously. As an example, in this context one or more wafer composites are arranged on a carrier, which is heated by the heating device. The process step can, for example, be the application of one or more epitaxial layers in the production of the at least one semiconductor chip.

In an advantageous embodiment according to the first aspect, the heating device has a heating plane and is designed such that, in the production of semiconductor chips, the heating plane can be arranged parallel to a plane of the semiconductor chips in the wafer composite.

The heating plane is to be understood here in particular as a plane of a lateral extension of the heating device. The plane of the semiconductor chips in the wafer composite is a plane of the lateral extension of the wafer composite, in the case of a disc-shaped wafer composite thus a plane of the disc. By arranging the wafer composite parallel to the heating plane, the temperature of the wafer composite can in particular be influenced areally.

In a further advantageous embodiment according to the first aspect, the heating device further comprises a first heating unit extending substantially in a radial direction with respect to a reference point in the heating plane.

An extension substantially in the radial direction with respect to the reference point in the heating plane means a surface portion in the heating plane that has a first extension component in the radial direction and a second extension component transverse to the radial direction, the first extension component being greater than or equal to the second extension component. In particular, the first extension component is many times greater than the second extension component, i.e., at least twice, in particular at least four times, preferably at least ten times greater. In a stationary arrangement of the heating device parallel to the above-mentioned carrier, the first heating unit thus only covers part of the carrier.

In another advantageous embodiment according to the first aspect, the heating device has a heating plane that can be arranged parallel to a plane of the semiconductor chips in the wafer composite during the production of semiconductor chips. The heating device further comprises a first heating unit extending substantially in a radial direction with respect to a reference point in the heating plane.

In an advantageous way, this allows a targeted heating of the wafer composite in the radial direction. In contrast to a heating device which has only essentially radially symmetrically, circularly, near-circularly or spirally arranged heating elements such as heating coils, a temperature of the wafer composite can thus be influenced comparatively quickly and locally precisely. Especially in the case that the heating device rotates with respect to the wafer composite or a carrier thereof, the temperature of the wafer composite can also be precisely influenced in a tangential direction or over an entire area in contrast to the aforementioned radially symmetrical, circular, near-circular or spiral-shaped heating elements.

In an advantageous embodiment according to the first aspect, the first heating unit comprises at least one inductive heating element for heating a carrier of the wafer composite.

In particular, the first heating unit comprises a plurality of inductive heating elements, such that the first heating unit extends substantially in the radial direction. As an example, the inductive heating elements are arranged in an elongated surface portion of the heating plane, which extends from the reference point to an edge of the heating device.

For example, the at least one inductive heating element is an electromagnet or a permanent magnet. The at least one inductive heating element is designed in particular to provide a magnetic field which varies with time with respect to the wafer composite. As an example, the at least one inductive heating element designed as an electromagnet can be modulated at high frequency for this purpose. Alternatively or in addition, a laterally adjacent arrangement of several inductive heating elements is also conceivable, by means of which the aforementioned modulation is achieved during rotation of the heating device with regard to the wafer composite or the carrier. For this purpose, for example, inductive heating elements adjacent laterally in the direction of rotation are aligned with mutually opposing poles.

In an advantageous way, this allows a generation of eddy current losses in electrically conductive materials arranged parallel to the heating device. If the carrier of the wafer composite is formed from an electrically conductive material, the carrier and the wafer composite can thus be heated efficiently.

In a further advantageous embodiment according to the first aspect, the at least one inductive heating element is formed as an electromagnet for generating eddy currents in the carrier of the wafer composite and is aligned with its magnetic poles perpendicular or substantially perpendicular to the heating plane.

In a further advantageous embodiment according to the first aspect, the first heating unit comprises a plurality of inductive heating elements arranged adjacent to each other in the radial direction. The inductive heating elements each have a predetermined distance to the reference point.

In an advantageous way, this allows targeted heating of the wafer composite or the carrier in the radial direction. In particular, a very fine local resolution of the heating in the radial direction can be achieved, for example, a resolution between 5 mm and 20 mm. A strength and/or a modulation frequency of the magnetic field provided by the individual inductive heating elements can be individually selected depending on the predetermined distance.

In a further advantageous embodiment according to the first aspect, the first heating unit comprises a plurality of inductive heating elements arranged adjacent to each other transversely to the radial direction. The inductive heating elements are arranged in such a way that the mutually adjacent heating elements have a predetermined offset in the radial direction to each other.

In an advantageous way, this allows an extremely fine local resolution of the heating in the radial direction. For example, the heating device has two or more rows of inductive heating elements adjacent in the radial direction, each with the predetermined offset to each other.

In a further advantageous embodiment according to the first aspect, the heating device has a second heating unit which extends circularly, near-circularly or spirally around the reference point and is arranged in the heating plane.

In particular, the second heating unit may comprise or consist of one or more substantially circular, elliptical, cylindrical or spiral heating elements. For example, the heating elements of the second heating unit are arranged radially symmetrical or essentially radially symmetrical to the reference point. In contrast to the first heating unit, the second heating unit, in a stationary arrangement of the heating device parallel to the carrier, covers at least a large part of the carrier.

In an advantageous way, this allows an easy, constant and areal heating of the wafer composite or a carrier thereof.

In another advantageous embodiment according to the first aspect, the second heating unit comprises at least one heating coil.

According to a second aspect, embodiments of the invention relate to a method for producing semiconductor chips in a wafer composite. In the method a carrier with a wafer plane and a reference point is provided. The carrier is designed to accommodate at least one wafer composite in the wafer plane.

Further, a heating device comprising a heating plane and a first heating unit is provided. The first heating unit is arranged laterally offset to the reference point in the heating plane. The heating device is arranged with its heating plane parallel to the wafer plane.

In this method at least one wafer composite is arranged in the wafer plane of the carrier. The carrier and the heating device are rotated relative to each other about an axis perpendicular to the heating plane and the wafer plane through the reference point. The first heating unit is controlled in such a way that a temperature of the carrier is influenced.

For example, the heating device may have a first heating unit with merely a single electromagnet positioned laterally with respect to the reference point with a predetermined offset to compensate for temperature inhomogeneities of the wafer composite along the offset around the reference point. In particular, however, the first heating unit has a plurality of inductive heating elements arranged adjacent with respect to the reference point in the radial direction. As a heating unit, the heating device according to the first aspect is particularly advantageous for the method according to the second aspect. All features disclosed in connection with the heating device according to the first aspect are therefore also applicable to the method according to the second aspect and vice versa.

In an advantageous way, the method allows targeted heating of the wafer composite in the tangential direction. In contrast to a heating device which has only essentially radially symmetrically, circularly, near-circularly or spirally arranged heating elements such as heating coils, here a temperature of the wafer composite can be influenced comparatively quickly. Especially in the case that the first heating unit extends essentially in the radial direction with respect to the reference point in the heating plane, the temperature of the wafer composite can be precisely influenced over a whole area.

In an advantageous embodiment according to the second aspect, the heating device has a second heating unit which extends circularly, near-circularly or spirally around the reference point and is arranged in the heating plane. The second heating unit comprises at least one heating coil. In this method, the second heating unit is controlled in such a way that a temperature of the carrier is influenced.

In an advantageous embodiment according to the second aspect, a temperature characteristic value is provided which is representative of at least one local temperature in the wafer plane of the carrier. The first heating unit is controlled depending on the temperature characteristic value.

The temperature characteristic value can be an estimated value or the result of a statistical evaluation of temperature measurements in a particular method step in the production of semiconductor chips. In an advantageous way, controlling the first heating unit depending on the temperature characteristic value allows a targeted setting of a local temperature of the at least one wafer composite. In particular, typical temperature differences such as those that occur in a contact area of the at least one wafer composite on the carrier with respect to a remaining area of the respective wafer composite can be compensated in this way.

In another advantageous embodiment according to the second aspect, a temperature sensor is provided by means of which the temperature characteristic value is determined.

In an advantageous way, a local temperature of the at least one wafer composite can thus be set particularly precisely. The temperature sensor can, for example, be an infrared camera.

In another advantageous embodiment according to the second aspect, a bending sensor is provided to determine a bending characteristic value. The bending characteristic value is representative of a bending of the at least one wafer composite relative to the wafer plane. In this method, the first heating unit is controlled depending on the bending characteristic value.

In an advantageous way, this allows a precise setting of a local temperature of the at least one wafer composite, essentially independent of its bending. In this case, a curvature of the respective wafer composite facing towards or away from the carrier can be considered as a bend. Typically, such a bend varies depending on the method step in which epitaxial layers are applied.

To determine the bending characteristic value, a deflection of a laser beam directed at the respective wafer composite can be used, for example. In particular, a control device for controlling the first heating unit in this connection can be coupled to a measuring system which has an optical module for generating and measuring the laser beam. With increasing curvature of the respective wafer composite, the laser beam reflected from a surface of the respective wafer composite is, for example, deflected further from a rest position, which would be hit by a laser beam reflected from a flat wafer plane. Depending on the deflection of the laser beam, i.e., a distance of the reflected laser beam from the rest position, a bending of the respective wafer composite can be inferred. In particular, an average or total bending of the respective wafer composite is determined. Alternatively, local curvatures can also be determined, for example, by generating and measuring an array of parallel laser beams.

In a further advantageous embodiment according to the second aspect, the carrier and the heating device are rotated relative to each other at a predetermined rotational speed. In this method, the first heating unit is controlled depending on the rotational speed.

In an advantageous way this allows a precise setting of a local temperature of the at least one wafer composite. The fine local resolution of the heating in the radial direction mentioned above can also be used here and transferred to the complete carrier by the rotational movement. For example, the given rotational speed can be a rotational speed in the range of 1000 to 3000 revolutions per minute that is usual for the production of semiconductor chips. The control of the first heating unit, in particular of the individual inductive heating elements, is preferably synchronous with the rotational speed.

In a further advantageous embodiment according to the second aspect, the first heating unit comprises a plurality of inductive heating elements arranged adjacent to each other in the radial or substantially radial direction and each having a predetermined distance from the reference point. In this method, the inductive heating elements are controlled depending on their respective predetermined distance from the reference point.

In an advantageous way, this allows a particularly precise setting of the local temperature of the at least one wafer composite. For example, temperature differences in the contact area and/or due to a bending of the respective wafer composite can be compensated in this context.

In another advantageous embodiment according to the second aspect, the first heating unit is controlled in such a way that a local temperature inhomogeneity of the at least one wafer composite is minimized.

In particular, the first heating unit is controlled in such a way that the at least one wafer composite has a substantially locally constant temperature. In an advantageous way, this allows a largely homogeneous performance of the produced semiconductor chips. In particular, in the production of light-emitting diode chips, a shift in the wavelength and/or an influence on the brightness of the produced light-emitting diode chips during operation can thus be prevented.

In a further advantageous embodiment according to the second aspect, the respective wafer composite is divided into virtual segments in the radial direction, each segment being assigned a temperature characteristic value and/or a bending characteristic value which represents a tangential temperature or bending curve of the at least one wafer composite. Each of the segments is assigned to an inductive heating element. Depending on an orientation of the carrier with respect to the heating device and depending on the respective temperature and/or bending characteristic value, the at least one inductive heating element is controlled to heat the respective segment at a position corresponding to the position of the respective inductive heating element with an intensity which locally compensates the respective temperature and/or bending characteristic value to a predetermined target value.

The subdivision in the radial direction depends, for example, on a number of inductive heating elements and their range of influence with regard to the respective wafer composite. This results, for example, in a number of tangential temperature or bending curves of the at least one wafer composite corresponding to the number of inductive heating elements, which extend around the reference point and are arranged in a staggered manner in the radial direction.

According to a third aspect, embodiments of the invention relate to a system for producing semiconductor chips in a wafer composite. The system comprises a carrier having a wafer plane and a reference point, the carrier being designed to accommodate at least one wafer composite in the wafer plane.

The system also includes a heating device with a heating plane and a first heating unit. The first heating unit is arranged laterally offset to the reference point in the heating plane. The heating device is arranged with its heating plane parallel to the wafer plane.

The system further comprises a rotational element designed to effect a rotation the carrier and the heating device relative to each other about an axis perpendicular to the heating plane and the wafer plane through the reference point, and a control device designed to control the first heating unit in such a way that a temperature of the carrier is affected.

For example, the heating device may have a first heating unit with merely a single electromagnet arranged laterally with respect to the reference point with a predetermined offset to compensate for temperature inhomogeneities of the wafer composite along the offset around the reference point. In particular, however, the first heating unit has a plurality of inductive heating elements arranged adjacent with respect to the reference point in the radial direction. As a heating unit, the heating device according to the first aspect is particularly suitable for the system according to the third aspect. All features disclosed in connection with the heating device according to the first aspect are therefore also applicable to the system according to the third aspect and vice versa.

In particular, the control device is designed to perform method steps according to the second aspect. All features disclosed in connection with the method according to the second aspect are therefore also applicable to the system according to the third aspect and vice versa.

In an advantageous embodiment according to the third aspect, the heating device has a second heating unit which extends circularly, near-circularly or spirally around the reference point and is arranged in the heating plane. The second heating unit comprises at least one heating coil. The control device is further designed to control the second heating unit in such a way that a temperature of the carrier is influenced.

In an advantageous embodiment according to the third aspect, the carrier is formed from electrically conductive material. In particular, the carrier comprises or consists of graphite in at least one region of the at least one wafer composite. In an advantageous way, eddy current losses in the carrier can be caused by the first heating unit and the respective wafer composite can thus be heated in a targeted manner.

BRIEF DESCRIPTION OF THE DRAWINGS

Exemplary embodiments of the invention are explained in more detail below on the basis of the schematic drawings. In the Figures.

Elements of the same construction or function are provided with the same reference signs in all figures.

DETAILED DESCRIPTION OF ILLUSTRATIVE EMBODIMENTS

Figure 1A:
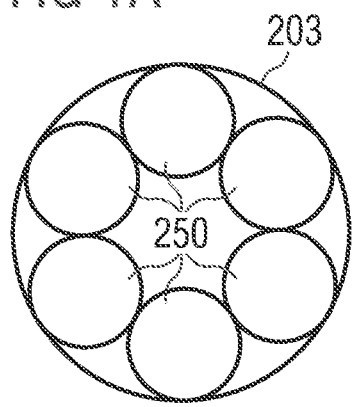
FIGS. 1a-1c show an exemplary system for producing semiconductor chips in a wafer composite.
Figure 1B:
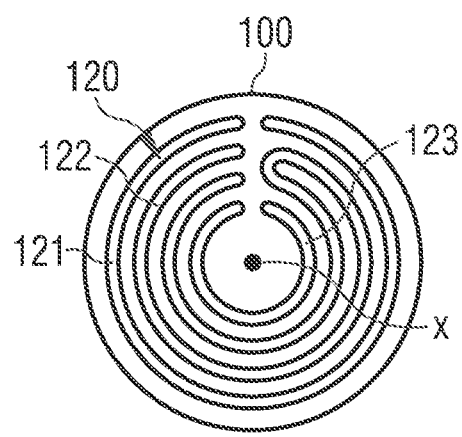
Figure 1C:
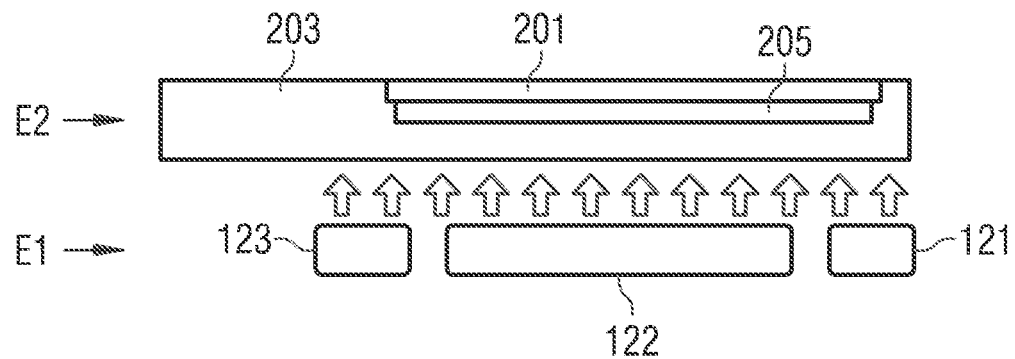

FIGS. 1a to 1c show an exemplary system for producing semiconductor chips in a wafer composite. The system comprises a disc-shaped carrier 203 (FIG. 1a) with six recesses 205, each designed to accommodate a disc-shaped wafer composite 201 (FIG. 1c). Only the outer edge of each wafer composite 201 rests on projections of the respective recess 205. Within this edge there is an air gap between the carrier 203 and the respective wafer composite 201, so there is no direct contact between the carrier 203 and the respective wafer composite 201.

The system also includes a heating device 100 (FIG. 1b). Said heating device comprises a heating unit 120 with three heating elements 121, 122, 123 which extend in a heating plane E1 (FIG. 1c) substantially circularly around a reference point x in the center of the heating device 100. The heating elements 121, 122, 123 are in particular heating coils.

In the system, the carrier 203 with the respective wafer composite 201 is arranged at a distance above the heating device 100 in a wafer plane E2 parallel to the heating plane E1 (FIG. 1c). The respective wafer composite 201 can be heated areally by heat radiation of the heating elements 121, 122, 123, wherein a temperature can be set by an appropriate heating current flowing through the heating elements 121, 122, 123. The outer heating element 121, the middle heating element 122 and the inner heating element 123 can each be operated separately. Due to the circular arrangement, however, it is not possible to set the temperature in the tangential direction. In addition, the heating elements 121-123 react very slowly and do not permit high-frequency operation.

During the production of semiconductor chips in a wafer composite 201, for example, when applying epitaxial layers, the carrier 203 with the respective wafer composite 201 is set into rotation around the reference point x at a predetermined rotational speed.

Figure 2A:
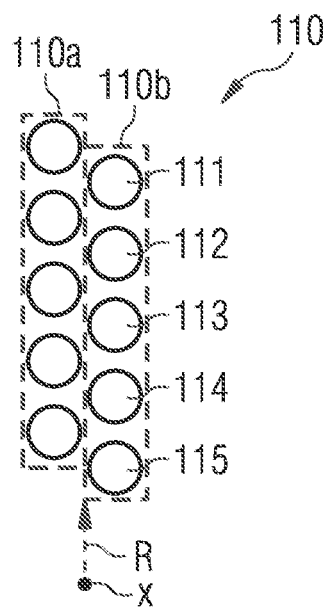
FIGS. 2a-2c show a first exemplary embodiment of a system for producing semiconductor chips in a wafer composite.
Figure 2B:
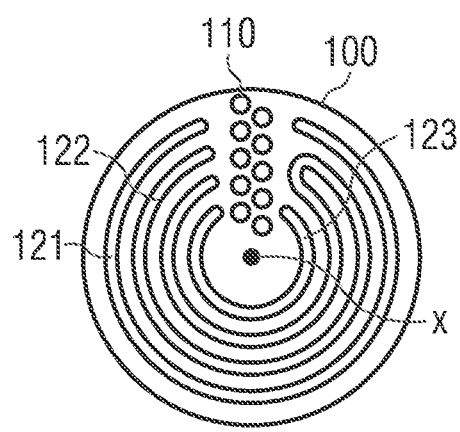
Figure 2C:
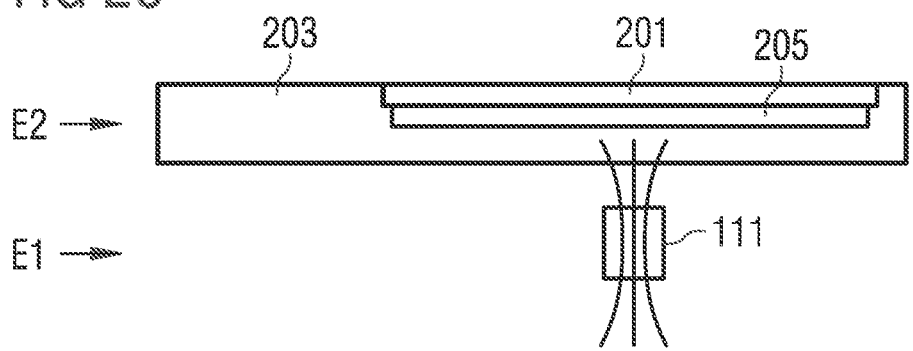

FIGS. 2a to 2c show a first exemplary embodiment of a system for producing semiconductor chips in a wafer composite. As in the previous example, the system comprises a carrier 201 with six recesses 205 to accommodate one wafer composite 201 each, which is arranged with its wafer plane E2 above a heating device 100 parallel to the heating plane E1 (FIG. 2c) and rotates around the reference point x.

However, in contrast to the previous example, the heating device 100 according to the first exemplary embodiment has a first heating unit 110 extending from the reference point x in the radial direction R (FIGS. 2a, 2b). Optionally, the heating device 100 also has a second heating unit 120 similar to the previous example with the heating elements 121, 122, 123.

As shown in FIG. 2a, the first heating unit 110 comprises two mutually offset rows 110a, 110b of inductive heating elements 111, 112, 113, 114, 115 each having a predetermined distance from the reference point x.

In other exemplary embodiments, however, it is also conceivable that the first heating unit 110 only comprises one row 110a of inductive heating elements 111-115 or even only one inductive heating element 113 arranged offset to the reference point x.

The inductive heating elements 111-115 are in particular electromagnets which can be controlled in such a way that eddy currents are generated in the carrier 203 due to the relative rotational movement between the carrier 203 and the heating device 100, which lead to local heating of the carrier 203 and the respective wafer composite 201. In this context, the carrier 203 is formed from a conductive material such as graphite.

In addition, the electromagnets can be controlled in such a way that they generate a time-dependently varying magnetic field, in particular a high-frequency modulated magnetic field. This can further increase the local heating of the carrier 203.

The strength and/or frequency of the magnetic field can be modulated so that, depending on the modulation, a locally precise, time-dependent heating of the carrier 203 is achieved. The modulation of the electromagnets can be synchronized in particular with the rotational speed of the carrier 203. Particularly preferably, depending on the angle of rotation and the respective distance of the electromagnets from the reference point x, each of the electromagnets can be controlled separately, so that the local temperature of the respective wafer composite 201 can be set precisely. The first heating unit 110 can, for example, be used to supplement the second heating unit 120 in order to adapt or compensate local temperature curves of the respective wafer composite 201.

Figure 3A:
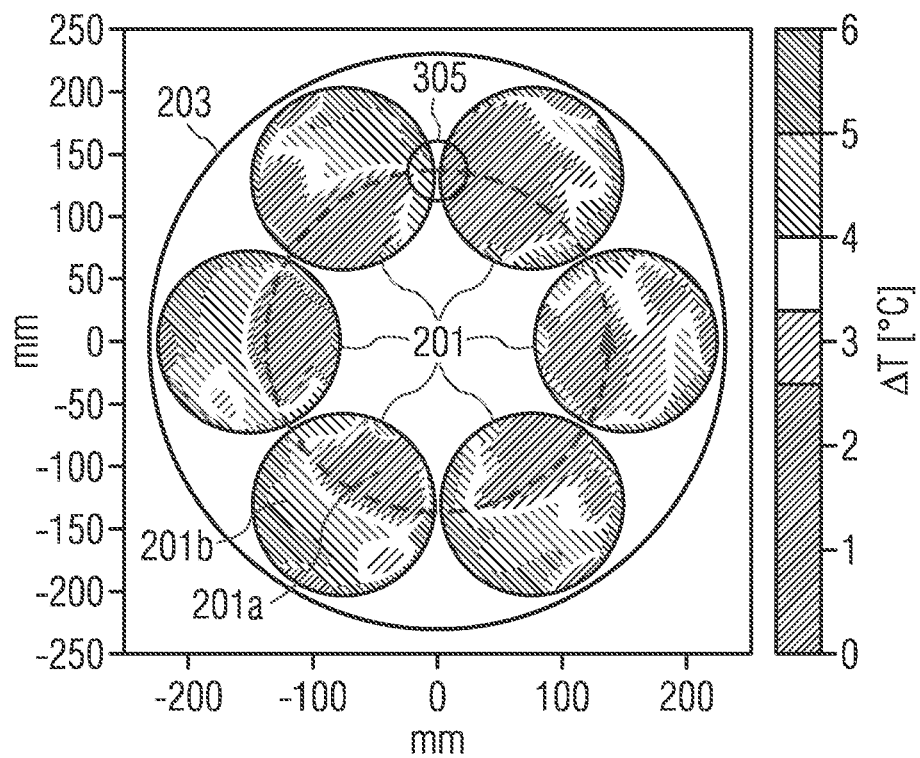
FIGS. 3a-3b show local temperature curves of the wafer composites according to the first exemplary embodiment.
Figure 3B:
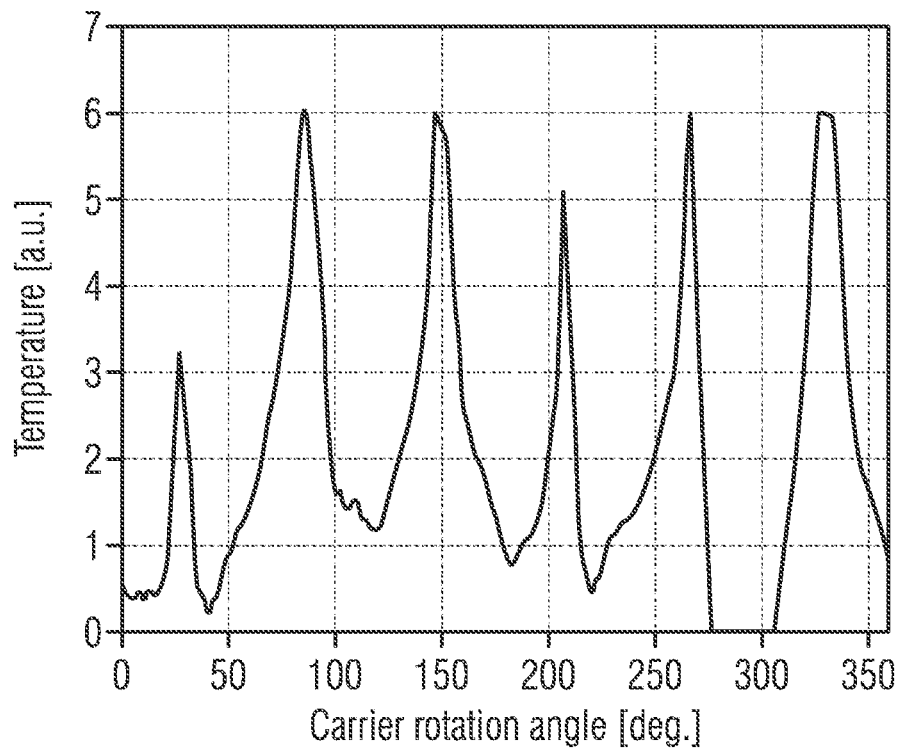

FIGS. 3a and 3b each show such a local temperature curve of six wafer composites 201 according to FIGS. 1a-2c.

FIG. 3a shows a snapshot of the local temperature of the wafer composites 201 over their entire surface area, as it occurs, for example, when heating the wafer composites 201 according to the example in FIGS. 1a-1c. Here, reference 201a refers to colder areas of the wafer composites 201 and reference 201b to warmer areas of the wafer composites 201.

In addition, a temperature sensor 305 is exemplarily shown at a predetermined distance (130 mm as an example) from the reference point x, which only records a section of the temperature of the wafer composites 201 and is spatially fixed with respect to the heating device 100. As indicated by the dotted arrow, the carrier 203 rotates with the wafer composites 201 analogously to the previous FIGS. 1a-2c, so that, depending on the angle of rotation, a local temperature curve is detected by the temperature sensor 305 along the arrow shown in FIG. 3b.

In order to compensate for the illustrated temperature inhomogeneity of the individual wafer composites 201, the first heating unit 110 could be controlled in such a way that the comparatively cool areas 201a of the wafer composites 201 are additionally heated. A control signal for modulating the magnetic field of the inductive heating element 113, whose predetermined distance to the reference point x corresponds approximately to that of the temperature sensor 305 shown, can be selected proportionally to the temperature curve shown in FIG. 3b. A control signal for the other inductive heating elements 111, 112, 114 and 115 can in the present case, for example, be based on estimated values and/or be determined depending on the displayed temperature curve.

Figure 4A:
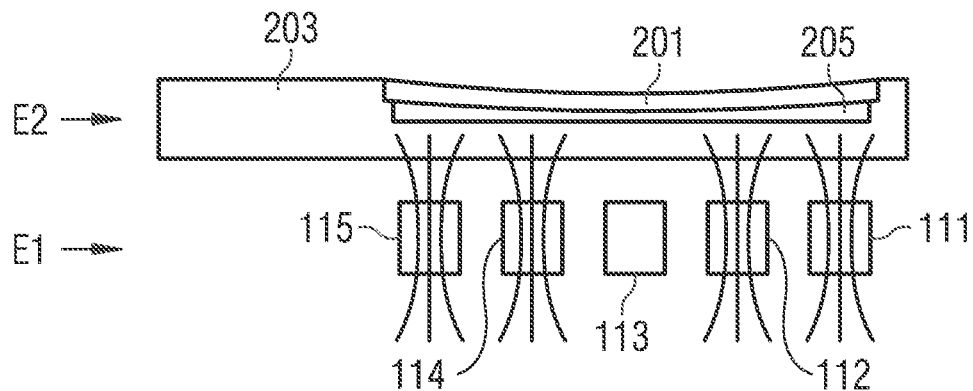
FIGS. 4a-4b show bending of a wafer composite according to the first exemplary embodiment.
Figure 4B:
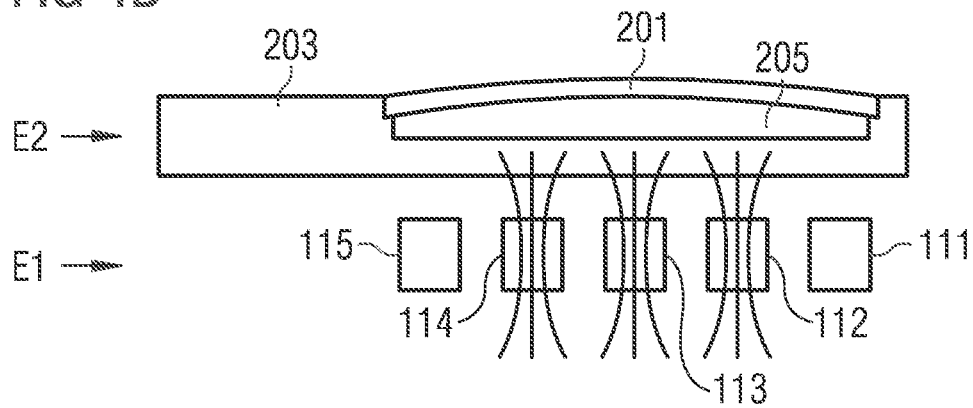

Alternatively or in addition, the first heating unit 110 can also be operated in such a way that bends of the respective wafer composite 201 are compensated. Such a bending of a wafer composite 201 according to the first exemplary embodiment is shown in FIGS. 4a and 4b.

Due to a curvature of the wafer composite 201 facing the carrier 203 (FIG. 4a), the air gap in the recess 205 between the carrier 203 and the wafer composite 201 is reduced, so that a middle region of the wafer composite 201 is heated more strongly than an outer region of the wafer composite 201 during uncompensated heating according to the example in FIGS. 1a-1c. In order to compensate for this temperature inhomogeneity, the first heating unit 110 could be controlled in such a way that areas of the wafer composite 201 with a wider air gap are additionally heated. As an example, the inductive heating elements 111-115 are controlled in such a way that a stronger and/or higher-frequency magnetic field is generated by the inductive heating elements 111, 115 than by the inductive heating elements 112, 114, and the inductive heating element 113 is put into a switched-off operating state.

With a curvature of the wafer composite 201 facing away from the carrier 203 (FIG. 4b), the situation is exactly the other way round. As an example, the inductive heating elements 111-115 are then controlled in such a way that a weaker and/or lower-frequency magnetic field is generated by the inductive heating elements 112, 114 than by the inductive heating element 113, and the inductive heating elements 111, 115 are put into a switched-off operating state.

Figure 5:
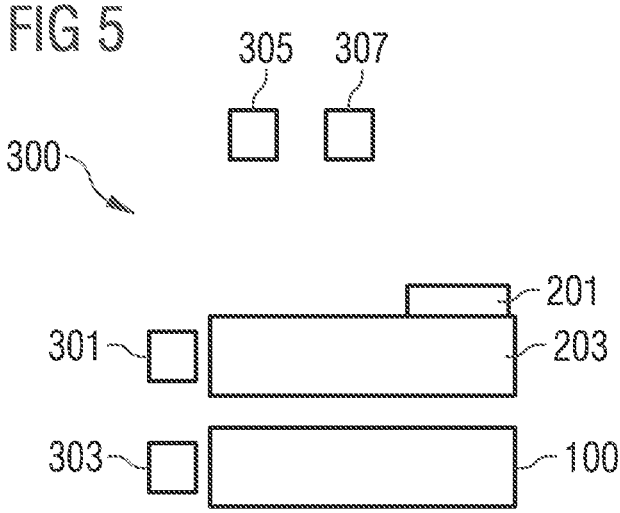
FIG. 5 shows a third exemplary embodiment of a system for producing semiconductor chips in a wafer composite.

FIG. 5 schematically shows a second exemplary embodiment of a system 300 for producing semiconductor chips in a wafer composite 201. Similar to the previous example, the heating device 100 and the carrier 203 with the wafer composite 201 are arranged parallel and rotatable to each other in the system 300. The system 300 is assigned a rotational element 301, which is designed to set the carrier 203 into rotation at a predetermined rotational speed. The system 300 further comprises a control device 303 designed to control the first heating unit 110.

The system 300 also includes one or more temperature sensors 305. A bending sensor 307 is also used to determine the bending according to FIGS. 4a and 4b. The sensors 305, 307 are coupled on the output side with the control device 303. The control of the inductive heating elements 111-115, for example, is dependent on the detected temperature and bending, in particular synchronous with the rotational speed.

The invention is not limited by the description on the basis of the exemplary embodiment to the latter. Rather, the invention includes any new feature and any combination of features, which in particular includes any combination of features in the patent claims, even if that feature or combination itself is not explicitly mentioned in the patent claims or exemplary embodiments.

The invention claimed is:

1. A heating device for producing semiconductor chips in a wafer composite, the heating device comprising:

a heating plane configured to be arranged parallel to a plane of the semiconductor chips in the wafer composite;

a first heating unit extending substantially in a radial direction with respect to a reference point in the heating plane, wherein the first heating unit comprises a plurality of inductive heating elements arranged adjacent to each other in a substantially radial direction, each inductive heating element having a predetermined distance from the reference point, and wherein the inductive heating elements are formed as electromagnets or permanent magnets configured to generate eddy currents in a carrier of the wafer composite; and a second heating unit extending circularly or near-circularly around the reference point, wherein the second heating unit is arranged in the heating plane.

2. The heating device according to claim 1, wherein the inductive heating elements are aligned with their magnetic poles substantially perpendicular to the heating plane.

3. The heating device according to claim 1, wherein the first heating unit comprises a plurality of inductive heating elements arranged adjacent to each other transversely to the radial direction such that mutually adjacent heating elements have a predetermined offset in the radial direction from each other.

4. The heating device according to claim 1, wherein the second heating unit comprises at least one heating coil.

5. The heating device according to claim 1, wherein the first heating unit extends in a surface portion in the heating plane, the surface portion having a first extension component in the radial direction and a second extension component transverse to the radial direction, and wherein the first extension component is greater than the second extension component.

6. The heating device according to claim 1, wherein the first heating unit extends in a surface portion in the heating plane, the surface portion having a first extension component in the radial direction and a second extension component transverse to the radial direction, and wherein the first extension component is equal to the second extension component.

7. A heating device for producing semiconductor chips in a wafer composite, the heating device comprising:

a heating plane configured to be arranged parallel to a plane of the semiconductor chips in the wafer composite;

a first heating unit extending substantially in a radial direction with respect to a reference point in the heating plane, wherein the first heating unit comprises a plurality of inductive heating elements arranged adjacent to each other in a substantially radial direction, each inductive heating element having a predetermined distance from the reference point, and wherein the inductive heating elements are formed as electromagnets or permanent magnets configured to generate eddy currents in a carrier of the wafer composite; and a second heating unit extending spirally around the reference point, wherein the second heating unit is arranged in the heating plane.

8. The heating device according to claim 7, wherein the inductive heating elements are aligned with their magnetic poles substantially perpendicular to the heating plane.

9. The heating device according to claim 7, wherein the first heating unit comprises a plurality of inductive heating elements arranged adjacent to each other transversely to the radial direction such that mutually adjacent heating elements have a predetermined offset in the radial direction from each other.

10. The heating device according to claim 7, wherein the second heating unit comprises at least one heating coil.

11. The heating device according to claim 7, wherein the first heating unit extends in a surface portion in the heating plane, the surface portion having a first extension component in the radial direction and a second extension component transverse to the radial direction, and wherein the first extension component is greater than the second extension component.

12. The heating device according to claim 7, wherein the first heating unit extends in a surface portion in the heating plane, the surface portion having a first extension component in the radial direction and a second extension component transverse to the radial direction, and wherein the first extension component is equal to the second extension component.

* * * * *